United States Patent
Eberhardt et al.

(10) Patent No.: US 7,109,724 B2
(45) Date of Patent: Sep. 19, 2006

(54) METHOD AND APPARATUS FOR NONDESTRUCTIVE MEASUREMENT AND MAPPING OF SHEET MATERIALS

(75) Inventors: Nikolai Eberhardt, Bethlehem, PA (US); Jerome C. Licini, Macungie, PA (US); Steven C. Murphy, Pottsville, PA (US); William Zuidervliet, Allentown, PA (US)

(73) Assignee: Lehighton Electronics, Inc., Lehighton, PA (US)

( * ) Notice: Subject to any disclaimer, the term of this patent is extended or adjusted under 35 U.S.C. 154(b) by 0 days.

(21) Appl. No.: 10/915,877

(22) Filed: Aug. 11, 2004

(65) Prior Publication Data

US 2005/0253594 A1    Nov. 17, 2005

Related U.S. Application Data

(63) Continuation-in-part of application No. 10/137,188, filed on May 1, 2002, now Pat. No. 6,791,339.

(60) Provisional application No. 60/494,148, filed on Aug. 11, 2003.

(51) Int. Cl.
*G01R 27/04* (2006.01)
(52) U.S. Cl. .................................. 324/637
(58) Field of Classification Search ............... 324/637
See application file for complete search history.

(56) References Cited

U.S. PATENT DOCUMENTS

| | | | |
|---|---|---|---|
| 4,087,745 A | 5/1978 | Kennedy et al. | 324/642 |
| 4,605,893 A | 8/1986 | Braslau | 324/642 |
| 5,103,182 A | 4/1992 | Moslehi | 324/637 |
| 5,179,333 A | 1/1993 | Washizuka et al. | 324/158 |
| 5,196,786 A | 3/1993 | Usami et al. | 324/765 |
| 5,781,018 A | 7/1998 | Davidov et al. | 324/637 |
| 6,100,703 A * | 8/2000 | Davidov et al. | 324/631 |
| 6,771,372 B1 | 8/2004 | Traber | 356/399 |

OTHER PUBLICATIONS

PCT/US05/28254, PCT Search Report dated Dec. 5, 2005.

* cited by examiner

*Primary Examiner*—Vincent Q. Nguyen
*Assistant Examiner*—John Teresinski
(74) *Attorney, Agent, or Firm*—Duane Morris

(57) ABSTRACT

An apparatus for contactless measurement of sheet charge density and mobility includes a microwave source, waveguide, first, second and third detectors, and an eccentric bore mount for adjusting the sample. A circular waveguide, carrying the $TE_{11}$ mode, terminates by the sample behind which a short is located. A magnetic field is applied perpendicular to the plane of the sample, and an incident $TE_{11}$ wave causes an ordinary reflected wave and a reflected wave caused by the Hall effect. A first detector measures the ordinary reflected wave, which has the same polarization as the incident wave. A seperate probe measures the reflected wave caused by the Hall effect, whose polarization is perpendicular to the former. This reflected wave is detected, and the output combined with an attenuated; phase shifted, portion of the forward power at a single detector, to eliminate by destructive interference any spurious incident signal at said detector.

20 Claims, 9 Drawing Sheets

US 7,109,724 B2

METHOD AND APPARATUS FOR NONDESTRUCTIVE MEASUREMENT AND MAPPING OF SHEET MATERIALS

RELATED APPLICATIONS

This application claims the benefit of U.S. Provisional Patent Application No. 60/494,148, filed Aug. 11, 2003, and is a continuation-in-part from U.S. patent application Ser. No. 10/137,188, filed May 1, 2002, now U.S. Pat. No. 6,791,339, both of which are hereby incorporated by reference herein in their entireties.

FIELD OF THE INVENTION

The invention relates to nondestructive measurement and mapping of materials, particularly using microwaves in the measurement of sheet charge density, and mobility and sheet resistance in semiconductor wafers and flat panel displays.

BACKGROUND OF THE INVENTION

Existing instruments that employ microwaves in the measurement of sheet resistance in GaAs wafers employ an X-band waveguide configuration with a characteristic impedance of 300 ohms which does not permit accurate measurement of wafers with thin cap layers. Such instruments are discussed in U.S. Pat. No. 4,605,893, to Norman Braslau. One disadvantage of these instruments is an inability to separately measure the properties of multiple conducting layers in wafers that contain such layers, e.g. a high-electron-mobility transistor (HEMT) wafer, which contains a two-dimensional (2D) channel layer and a cap layer. Therefore, one must measure the sheet resistance and mobility at temperatures lower than 300 degrees Kelvin, such as at 77 degrees Kelvin, in such existing systems in order to increase the channel-layer mobility relative to the conductance of the cap layer. These instruments also require involved calibration procedures.

Destructive techniques for measurement of sheet resistance and mobility are also known. However, such techniques necessarily damage the wafers or other material being measured.

SUMMARY OF THE INVENTION

A device for nondestructive measurement of mobility and sheet charge density in sheet materials includes a microwave source, a circular waveguide configured to transmit microwaves received from the microwave source to a conductive sheet material, such as a semiconductor wafer or flat panel display, a first detector for receiving the forward microwave power, a second detector for detecting the microwave power reflected from the material, and a third detector for detecting the Hall effect power. A circular waveguide, carrying only the $TE_{11}$ mode, is terminated by the wafer behind which, at a distance of ¼ wavelength, a short is located. Perpendicular to the plane of the wafer (and along the axis of the waveguide), a variable magnetic field is applied. In this configuration, a given incident $TE_{11}$ wave will cause two reflected waves. One is the ordinary reflected wave in the same polarization as the incident one. This is used to measure sheet resistance. The other reflected wave is caused by the Hall effect. Its polarization is perpendicular to the former wave and this can be separately detected with a properly configured probe.

A device for measurement of mobility and sheet charge density in conductive sheet materials includes a microwave source; a circular waveguide positioned to receive microwave power from the microwave source; a mount adapted to position a sheet material item at a measurement location to receive microwave power transmitted from the circular waveguide; a magnet positioned to induce a magnetic field at the measurement location; a first detector positioned to detect the power of the microwave power source; a second detector positioned to detect the power of the microwave power reflected from a sheet material item in the measurement location; and a third detector positioned to detect a Hall effect microwave power. A fourth detector may be provided to detect magnetic field strength at the measurement location. The mount may have a surface and a disc positioned in the mount, said disc having a planar surface recessed from said mount surface, said disc being rotatable about an axis substantially perpendicular to the plane of said disc planar surface, and said disc having a bore therein, said bore not being coaxial with said axis of rotation;

A method for measurement of mobility and sheet charge density in conductive sheet materials includes generating microwave power; transmitting only the $TE_{11}$ mode of the generated microwave power successively to a sheet material sample; during the step of transmission, applying a magnetic field of selected intensities; detecting microwave field strength at a forward position; detecting microwave field strength reflected from each of a conductive short and a sample; detecting Hall effect microwave field strength; and, based on the detected microwave field strengths, calculating values for mobility and sheet charge density.

DETAILED DESCRIPTION

The present invention includes an apparatus and method for measurement of sheet resistance and sheet charge density in semiconductive materials. The device includes a microwave source, that has an output coupled to a waveguide configuration in which a small amount of the incident wave is diverted, and the greater portion of the incident wave is transmitted along a main branch. The main branch is coupled to a circular waveguide. The circular waveguide transmits only the $TE_{11}$ (transverse electric 1, 1) mode of the microwave power. The circular waveguide receives power at an interface, and outputs power to a test region having a mount for supporting either a conductive test item, such as a short, or a wafer or other conductive sheet item to be tested. A magnet is provided to apply a magnetic field at the test region. At least four values are detected in the calculation of sheet resistance and sheet charge density in a method and apparatus of the invention. A detector is provided to detect the total microwave power output. A second detector is provided to detect the strength of a conventional reflected wave in the same polarization as the incident wave. A third detector is provided to detect a second reflected wave having a polarization opposite to that of the incident wave. There is preferably provided a Hall effect probe to detect this rotated reflected wave, which probe is electrically coupled to a directional coupler. The diverted portion of the incident wave, after passing through a variable attenuator and variable phase shifter, is also coupled to this Hall directional coupler, in order to eliminate by destructive interferences any spurious incident signal at said detector. The Hall directional coupler is then coupled to a detector. A fourth detector detects the magnetic field strength.

Figure 1:
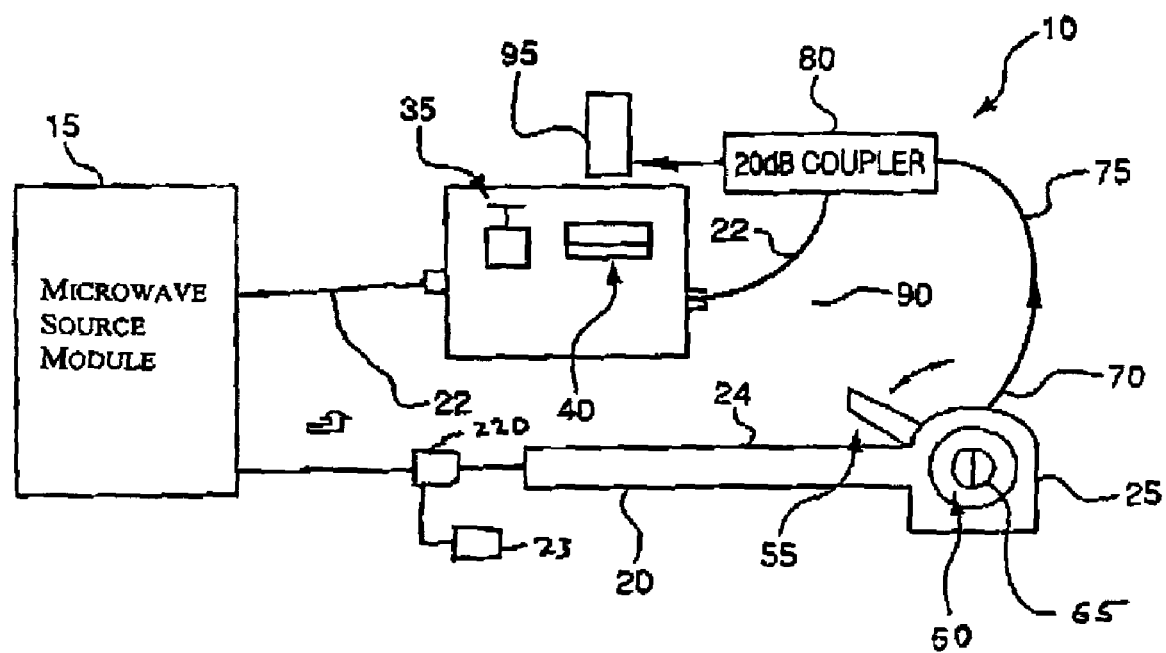
FIG. 1 is a schematic diagram of an apparatus according to the invention.
Figure 2:
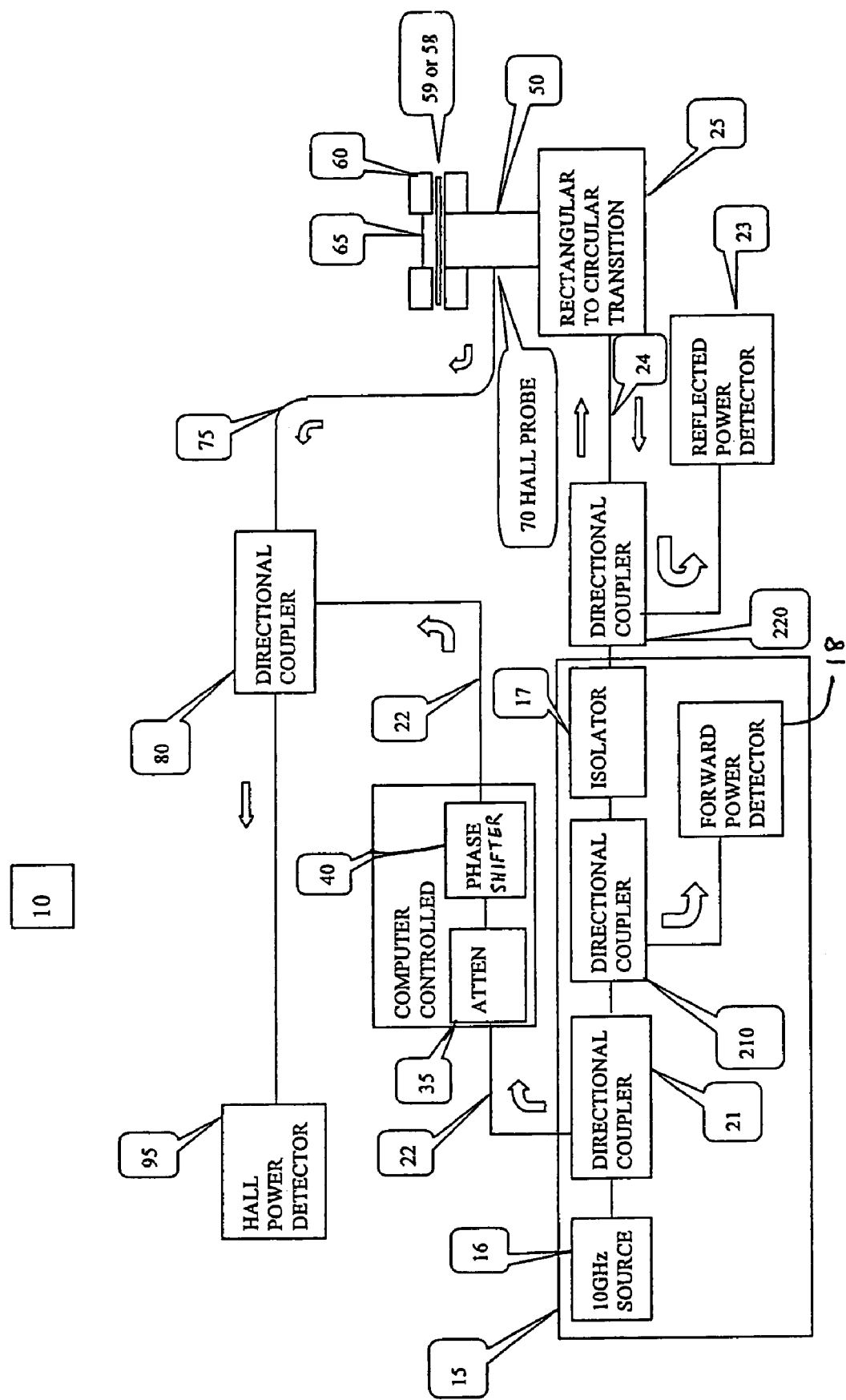
FIG. 2 is a schematic diagram of an apparatus according to the invention.

FIGS. 1 and 2 depict schematically the components of an apparatus 10 in accordance with the invention. Apparatus 10 includes microwave source module 15 which may provide microwaves having a frequency of about 10 GHz, although other frequencies may be employed. For example, higher frequencies may be employed to enable a smaller measurement area on the wafer or other item being tested. Source module 15 may include a Gunn diode, for example, and other sources may be employed. Source module 15 includes the microwave source 16, such as a Gunn diode, which is coupled to means for diverting a small portion of the forward power to a side branch, or attenuation and phase branch. The means for diverting a small portion of the forward power to a side branch may be coupler 21. Coupler 21 may be, for example, a cross guide coupler, and may be more specifically by way of example a 20 dB cross guide coupler or a directional coupler. Directional coupler 21 is coupled to side branch 22, discussed below. The majority of the power output by source 16 is coupled through coupler 21 to a second directional coupler 210. Second directional coupler 210 provides a portion of the power to forward power detector 18. Second directional coupler 210 may be a 10 dB coupler. Second directional coupler 210 outputs the majority of the power through a waveguide to isolator 17. Isolator 17 may be of conventional or other suitable design to prevent power from elsewhere in apparatus 10 from entering source 15. A second isolator may be used in series with isolator 17.

The diversion of a portion of the forward power to side branch 22 is used in properly balancing the Hall effect probe to zero in the absence of an applied magnetic field. The side branch 22 has a single computer controlled variable attenuator 35 and computer controlled variable phase shifter 40 in order to produce a very small signal of the proper phase that can be used to make an ultra-fine correlation in zeroing the Hall effect probe in the absence of a magnetic field. As the variable attenuator 35 and variable phase shifter 40 are preferably-computer controlled, adjustments are facilitated. It will be understood that, in principle, the variable attenuator and phase shifter could be manually adjustable.

The main output of coupler 21 will be referred to as main branch 24. Main branch 24 preferably has a waveguide for transmission of microwave power to transition 25. Main branch 24 may include conventional rectangular waveguide 20. As shown in FIG. 2, reflected power detector 23 is shown in main branch 24. Reflected power detector 23 detects microwave power being transmitted from transition 25 toward source 15. Reflected power detector 23 detects power reflected from test items back into main branch 24. Directional coupler 220, in main branch 24 and coupled to source 15 and transition 25, directs reflected power from main branch 24 to reflected power detector 23.

As noted above, a circular waveguide is provided positioned to receive microwave power from source 15. Specifically, circular waveguide 50 is coupled through coupler 21 and main branch 24 to source 15. Conventional rectangular waveguide 20 is coupled via a matched transition 25 into circular waveguide 50. Circular waveguide 50 is a cylindrical waveguide with a circular cross-section. Circular waveguide 50 transmits only the $TE_{11}$ mode of the power. Circular waveguide interface 25 is coupled to circular waveguide 50, shown, for example, in FIG. 2. The coupling of the circular waveguide 50 to conventional waveguide 20 must be calibrated carefully to minimize reflection and loss of signal strength. The calibration procedure is set forth below. Circular waveguide 50 is mounted on interface 25 perpendicular to the long axis of conventional waveguide 20. The calibration may be effected by adjustment of the position of circular waveguide 25 along its long axis relative to interface 25. In one embodiment, circular waveguide 50 is mounted on the interface 25. A circular waveguide adjustment 55 is provided in the form of a handle that rotates circular waveguide 50, so that the rotational position of circular waveguide 50 may be adjusted.

A mount 60 is provided to hold a sample of sheet material at a measurement location where microwave power transmitted from the circular waveguide 50 is received. The sample may be a wafer or other semiconductive test material 59. A moving short 65 is provided on the opposite side of the wafer or other material from the opening of circular waveguide 50. The moving short 65 will be placed ¼ wavelength from the wafer or other material. Moving short 65 may be in the form of a polished metal plug. Moving short 65 is mounted in mount 60, which may be in the form of a vacuum chuck. Mount 60 is adapted to hold a wafer or other material in sheet form at an end of circular waveguide 50 opposite to interface 25. Moving short 65 is provided inside of mount 60 and is capable of being positioned precisely. Mount 60 can move relative to circular waveguide 50 in order to adjust the gap between waveguide 50 and moving short 65.

A detector, forward power detector 18, is positioned in source module 15 to detect the forward power. As noted above, a directional coupler 220 is positioned in main branch 24 so as to direct reflected microwave power to detector 23. The reflected power detected by detector 23 has the same polarization as the forward microwave power. Hall probe 70 is inserted in circular waveguide 50 positioned to detect Hall effect microwave power reflected from material positioned in the vacuum chuck. Hall probe 70 may be located at a variety of positions within circular waveguide 50. The Hall effect power has polarization perpendicular to the polarization of the incident wave. As discussed below, the calibration and tuning process provides that only the Hall effect power is detected by Hall detector 95.

Hall probe 70 is coupled through coaxial line 75 to an input of directional coupler 80. Directional coupler 80 may be a 20 dB directional coupler. The output of branch 22, after passing through the attenuator module and variable phase shifter, is connected to an input of directional coupler 80. The output of directional coupler 80 is coupled to Hall detector 95. The calibration process, as described below, provides that the Hall detector 95 detects only power having a polarization perpendicular to that of the forward power. This power detected by Hall detector 95 is thus Hall effect power reflected from a sample.

Figure 3:
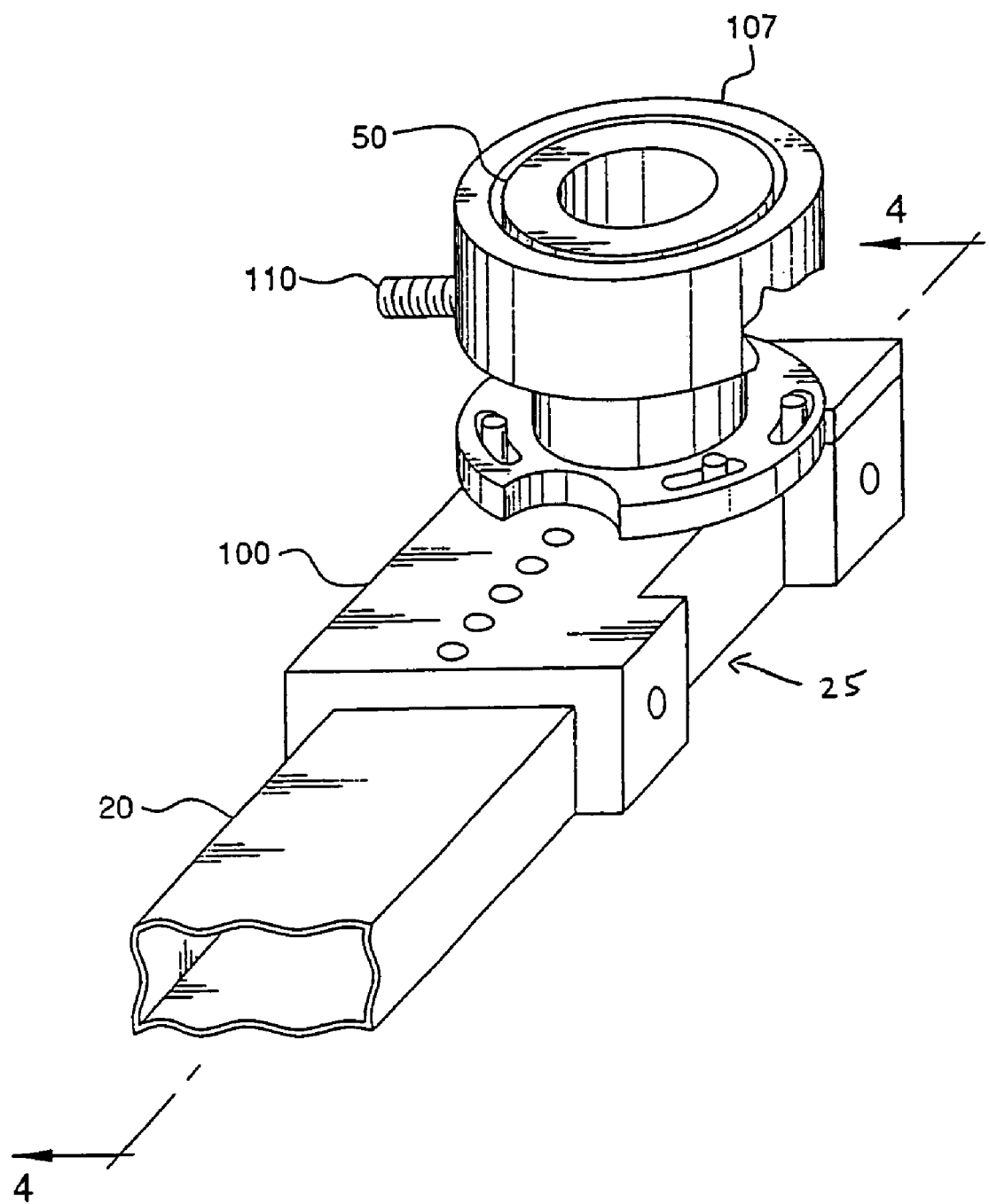
FIG. 3 is a view of a portion of an apparatus according to the invention.
Figure 4:
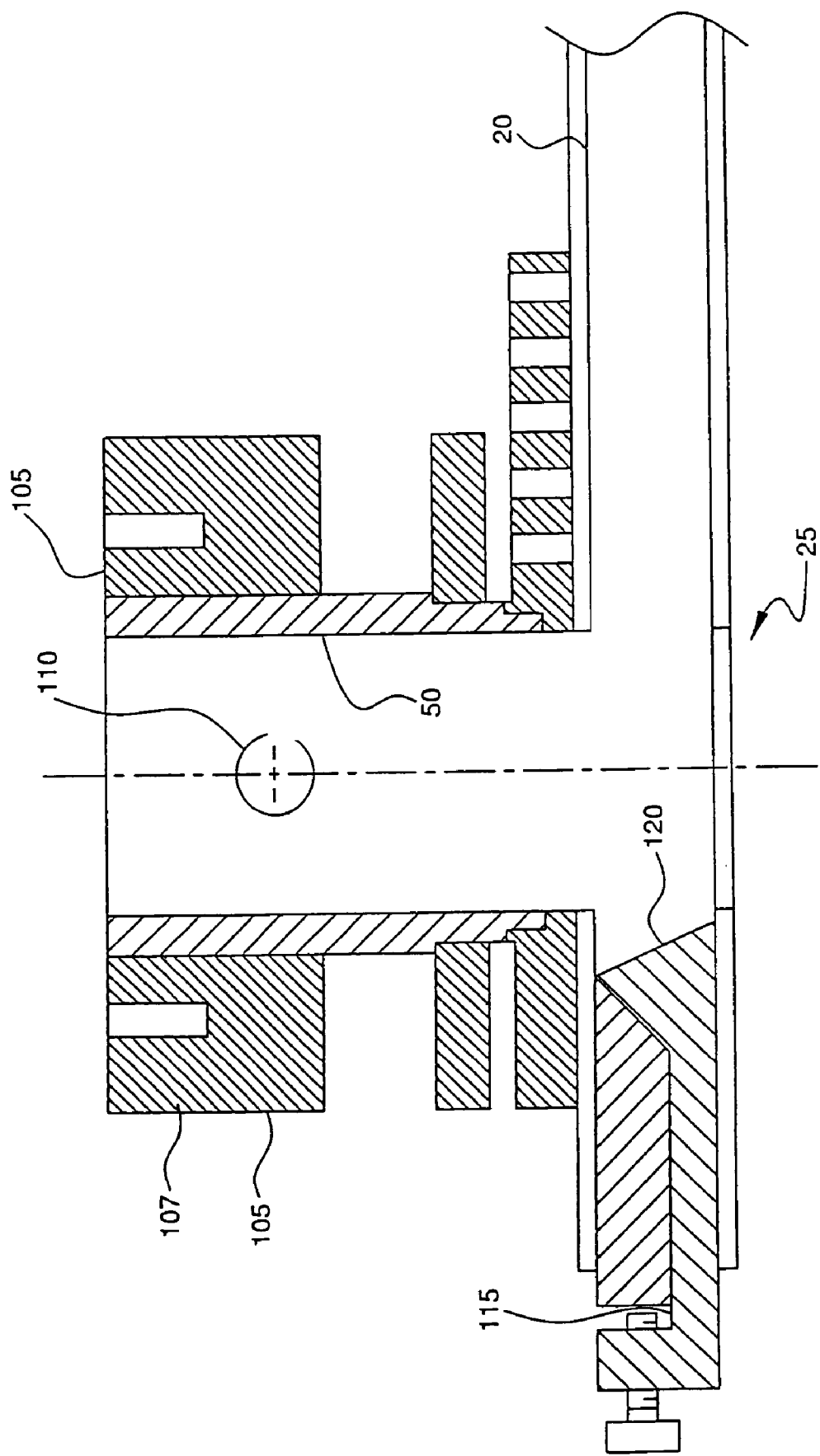
FIG. 4 is a cross-section of the apparatus of FIG. 3.

Details of an exemplary embodiment of the transition, circular waveguide, and mount will now be described. FIG. 3 is an isometric view, with partial cutaway, of interface 25. FIG. 4 is a sectional view along line 4—4 of FIG. 3. Interface 25 has a primary rectangular chamber 100 coupled at one end thereof to conventional waveguide 20. On an upper side of rectangular chamber 100 an aperture is provided to which circular waveguide 50 is attached. Interior to interface 25, opposite to conventional waveguide 20, there is provided a beam stop 115 completely filling an opening, and having a tapered face, preferably at an angle of 30 degrees to vertical, at 120. It will be appreciated that interface 25 may be modified by those of skill in the art by alternative designs to minimize reflection and loss at the interface between circular waveguide 50 and conventional waveguide 20. In FIGS. 3–4, it may be seen that circular waveguide 50 includes a probe flange 107 at an upper end thereof which has therein an opening for a probe at 110. A Hall probe may be inserted at 110.

Figure 5:
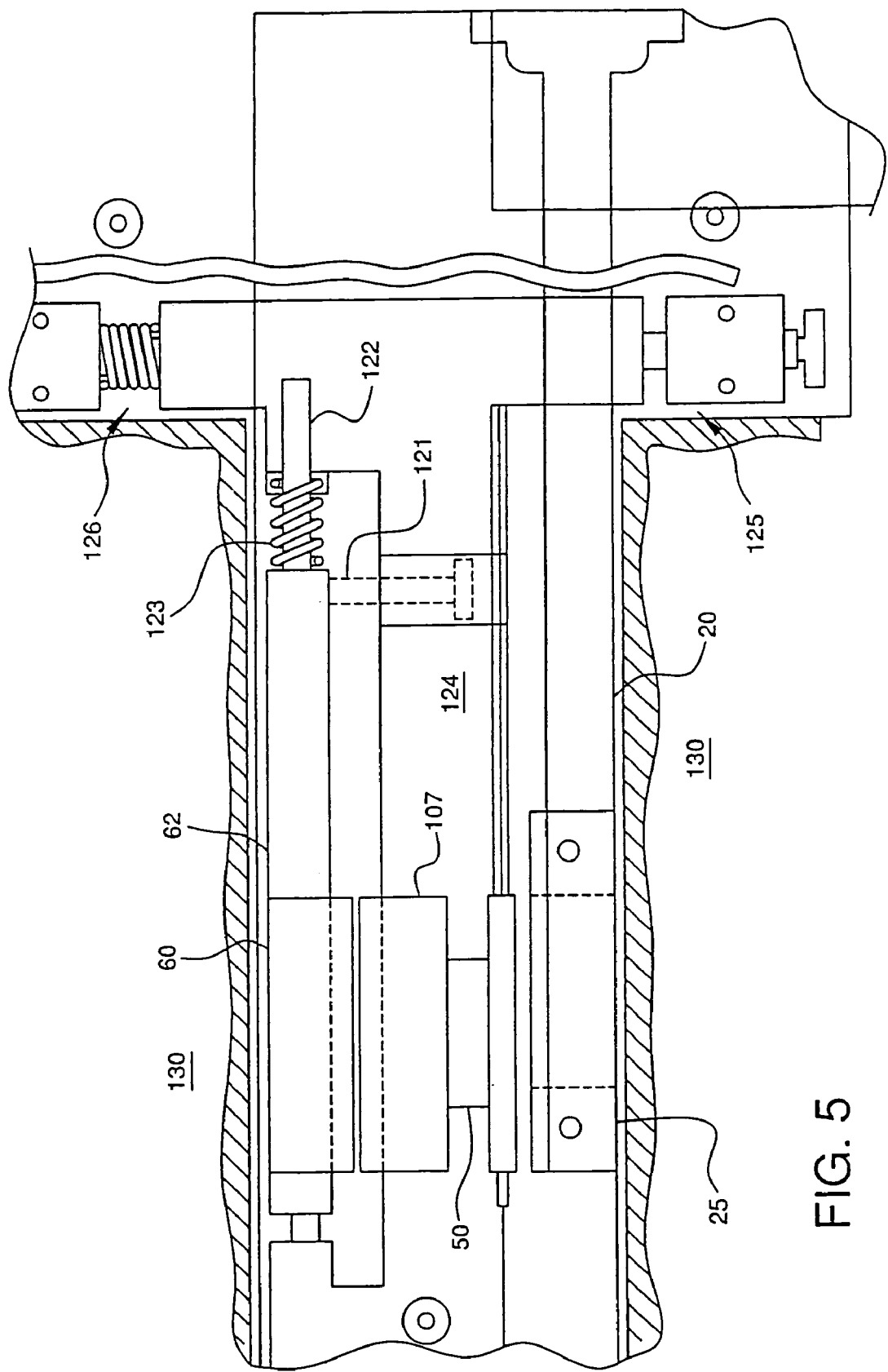
FIG. 5 is a view of an apparatus according to the invention.

FIG. 5 is a side view depicting an exemplary arrangement including circular waveguide 50, holder or mount 60, and related exemplary hardware. Holder or mount 60 serves to position a sheet material item to receive microwave power from circular waveguide 50. Conventional waveguide 20 is shown coupled to interface 25. Interface 25 is shown coupled to circular waveguide 50. Probe flange 107, located at an end of circular waveguide 50 opposite the coupling to interface 25, is opposite holder 60, in the form of a vacuum chuck. Vacuum chuck 60 is supported by an arm, which is chuck holder 62. Chuck holder 62 is supported by adjustable screws 121, 122, thereby permitting adjustment of the position of vacuum chuck 60 in two axes. Screws 121, 122 are supported on bridge 124, which is itself adjustably mounted as shown at 125, 126. Spring 123 may be provided on screw 122 to reduce the transfer of any vibrations in bridge 124. It will be understood that other configurations may be employed for the positioning of holder 60 relative to circular waveguide 50.

Figure 5A:
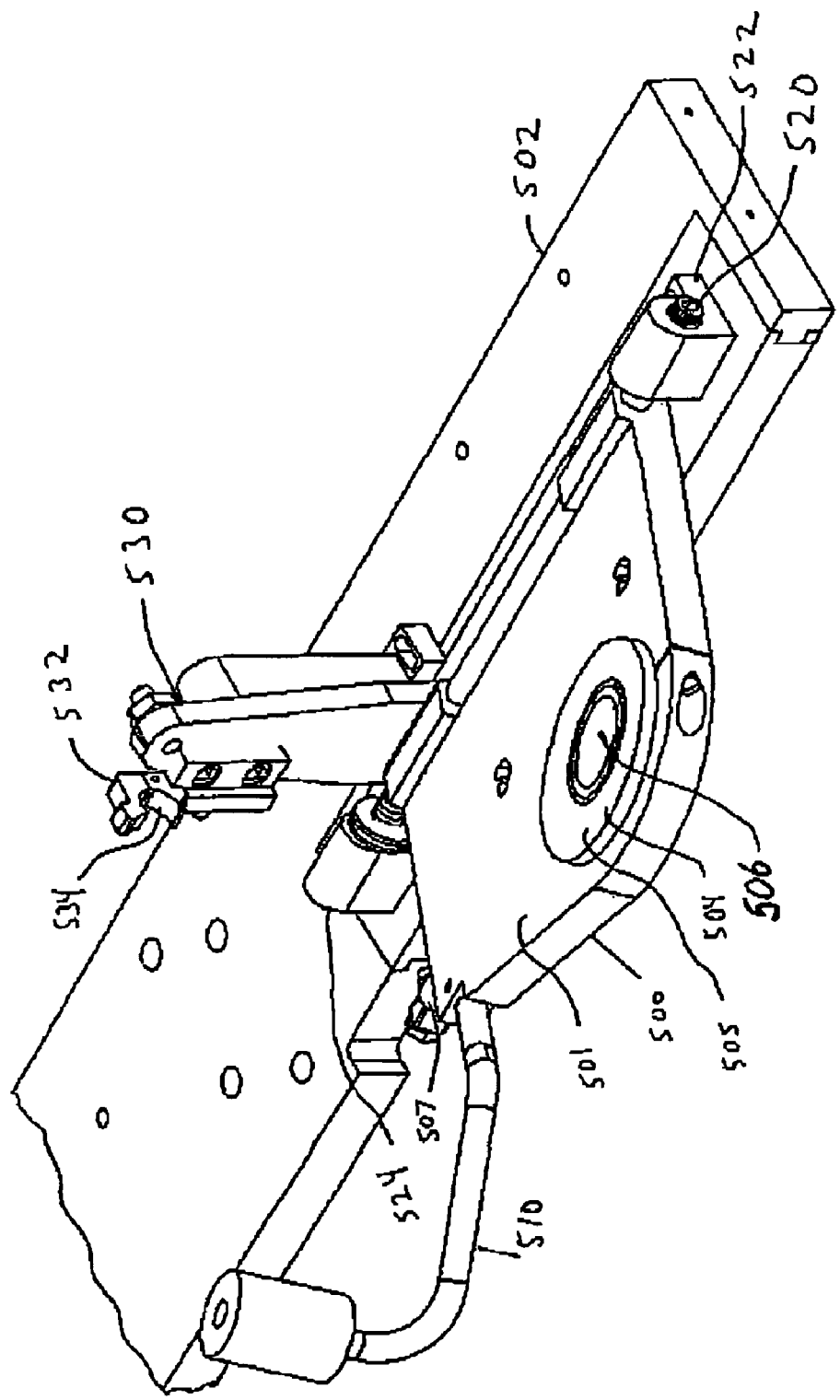
FIGS. 5A, 5B, and 5C are views of a component of an apparatus according to the invention.
Figure 5B:
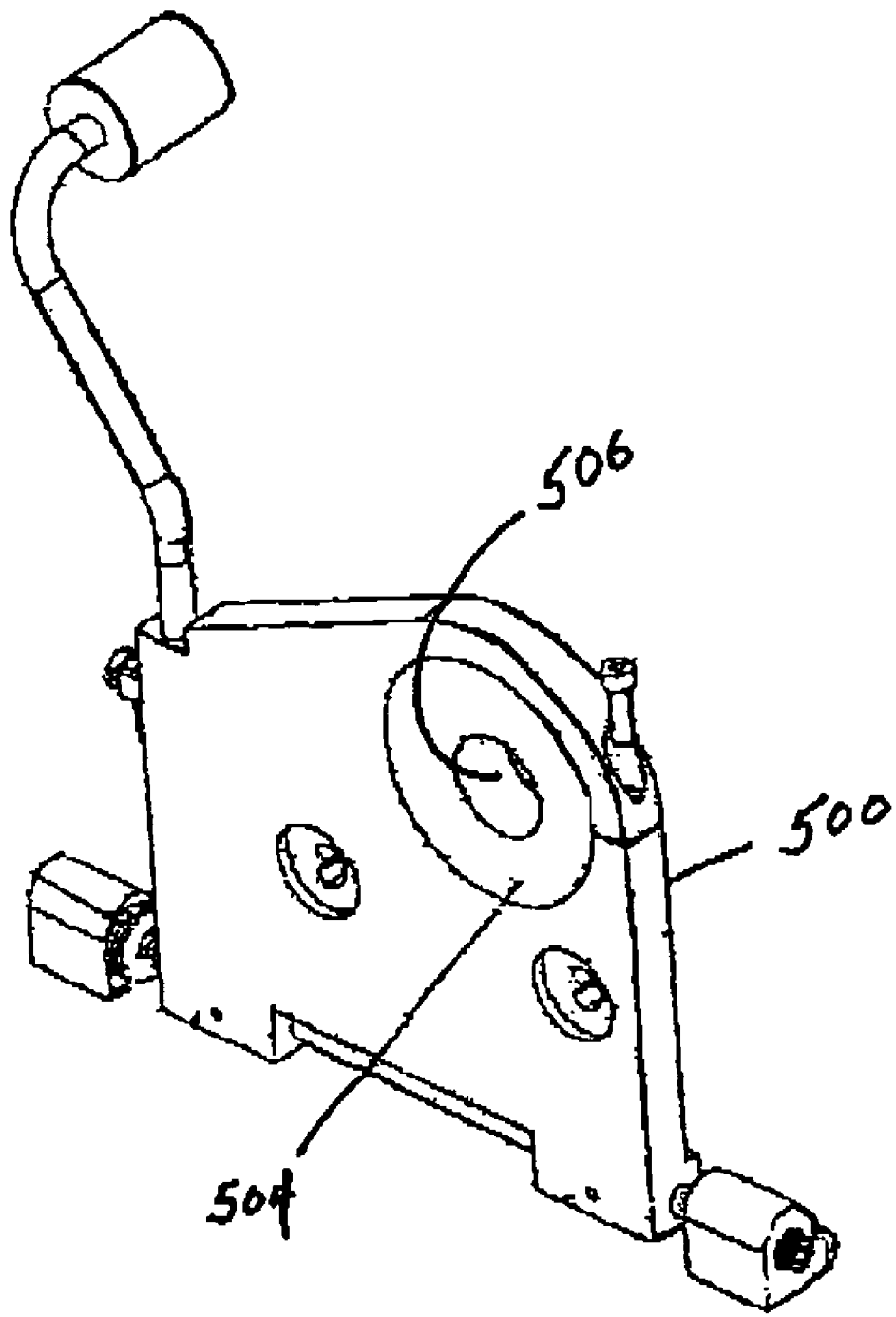

Referring to FIGS. 5A and 5B, example of a holder is shown. In this example, a positioning fixture 500 is rotatably mounted on a base 502. Fixture 500 has therein a rotatable disc 504 with a cylindrical through bore positioned off center. Disc 504 can be described as an eccentric slug in fixture 500. More particularly, fixture 500 has a surface 501, which is generally planar, and disc 504 has a surface 505, which may be planar and raised from mount surface 501. Mount surface 501 and disc surface 505 may be parallel. Disc 504 is rotatable about an axis substantially perpendicular to the plane of mount surface 501. Bore 506, which may define a right circular cylinder, is not coaxial with the axis of rotation of disc 504. Rotation of disc 504 adjusts the position of the bore 506 relative to base 502, effectively permitting adjustment of bore 506 in the vertical direction. Bore 506 defines the portion of a wafer or other material fixed on fixture 500 exposed to the output of circular waveguide 50. Rotation of disc 504 permits vertical adjustment, which combined with horizontal adjustment using screw 520 as described below, provides for alignment with waveguide 50. Fixture 500 may be a vacuum fixture or vacuum chuck, having an interior chamber at low pressure and small bores therein to fix material on the fixture. Connections can be made to a pump through a port at 507. Handle 510 may be employed to move fixture 500 in and out of position.

Fixture 500 is rotatably mounted on base 502 by a set screw 520 which presses on a shaft extends through bores in raised mounts 522, 524, which are rigidly fixed to base 502. A thrust bearing and a compression spring at mount 524 hold fixture 500 in place. Screw 520 engages a threaded bore in mount 522, so that rotation of screw 520 moves the shaft, thereby permitting fine adjustment of the position of the positioning fixture in a horizontal axis. In operation, the position of the fixture is adjusted by adjustment of both screw 520 and turning disc 504 until the fixture is properly positioned. The fixture 500 may then be locked in place. Arm 530, also rigidly fixed to base 502, prevents rotation of fixture 500 beyond a predefined point. An approximately semi-cylindrical concave surface defined on finger 532 of arm 530 receives a cylindrical knob 507 on an edge of fixture 500. Referring to FIG. 5B, fixture 500 is shown in a closed or operational position from the opposite side.

Figure 5C:
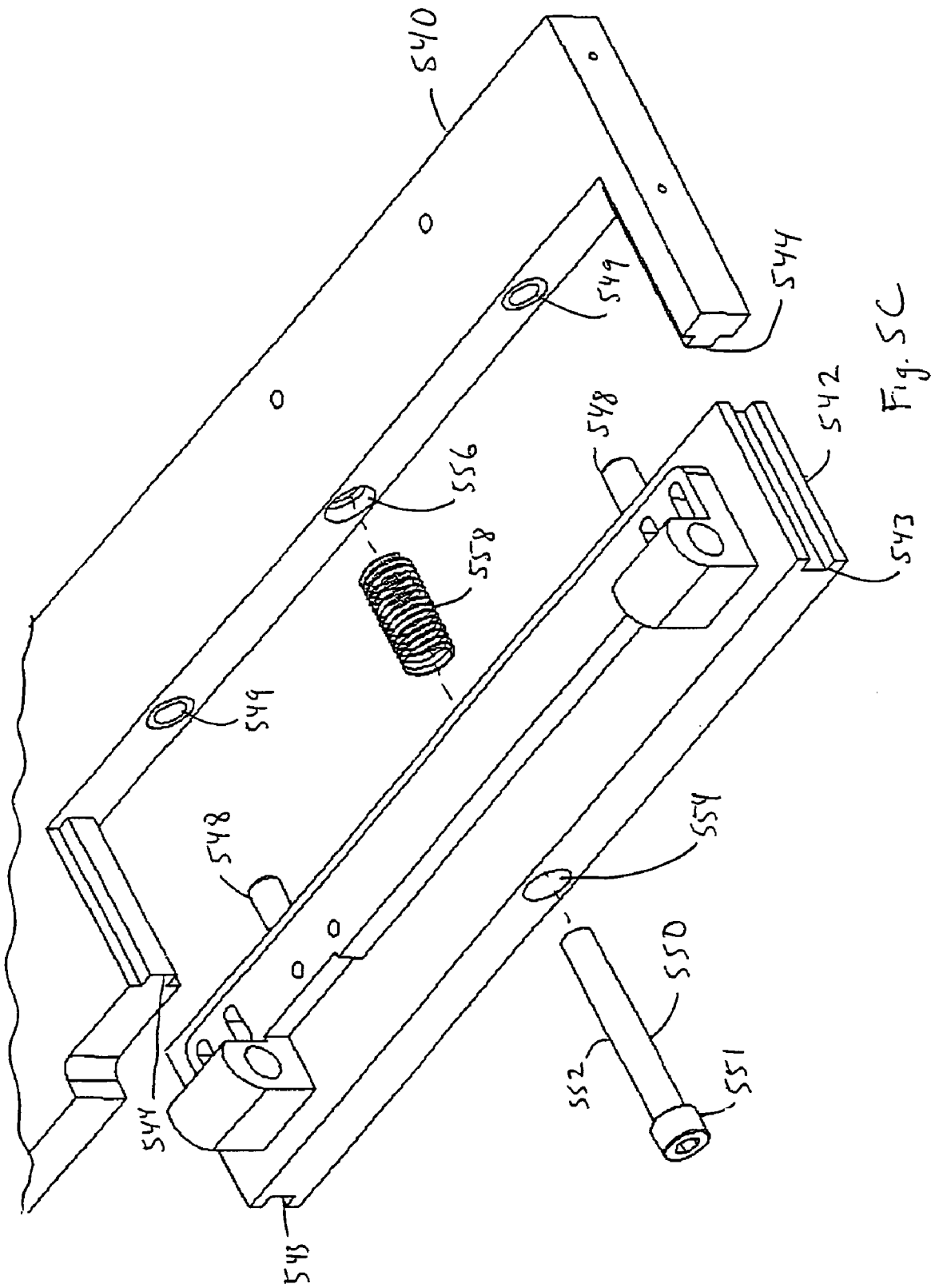

Referring to FIG. 5C, base 502 is divided into stationary portion 540 and movable portion 542, on which fixture 500 is mounted. Movable portion 542 is movable relative to stationary portion 540 perpendicular to the axis of screw 520, thereby permitting adjustment of the position of fixture 500 so as to adjust the gap between fixture 500 (and hence any sample mounted thereon) and the opening of circular waveguide 50. In this embodiment, mating grooves 543 and rails 544, and mating pins 548 and bores 549, permit adjustment of movable portion 542 in only one direction. A threaded pin 550 has a head 551 which engages a surface of movable portion 542; body 552 of pin 550 traverses a smooth bore 554 in movable portion 542 and engages a threaded bore 556 in stationary portion 540. A constant separation is further maintained by providing a device to urge movable portion 542 to the maximum separation permitted by the position of pin 550. An example is shown as coil spring 558, which engages surfaces of movable portion 542 and stationary portion 540. Any suitable substitute for coil spring 558 may be employed.

Referring again to FIG. 5, FIG. 5 also shows generally the position of magnet 130 which provides the necessary magnetic field. The magnetic field is applied perpendicular to the plane of the wafer or other sample and along the long axis of circular waveguide 50. The design of one or more suitable magnets to provide the desired magnetic field strength is within the level of ordinary skill in the art. As noted below, in one example, the magnetic field strength at the wafer or other item positioned in the holder is desirably up to 10 kG or higher, if necessary.

The calibration and operation of the apparatus will now be discussed. This entire process may be carried out at room temperature. Room temperature is understood to include a range of temperatures at which humans may comfortably work. Room temperature excludes low temperatures, such as the boiling temperature of liquid nitrogen at atmospheric pressure. Power meters are preferably connected to the Hall detector cable, an input or forward power location, and a reflected power location. A gauss meter is provided to measure the intensity of the magnetic field. Commercial meters with RS232 or IEEE 488 bus communications are preferably used. A short 58, such as a gold plated copper coated PC board, is placed on the vacuum chuck and positioned. The computer controlled attenuation adjustment 35 is increased to a maximum. The position of the circular waveguide 50 is adjusted to obtain minimum power at Hall detector 95. While monitoring the Hall detector power meter, the computer controlled attenuation adjustment 35 is then adjusted, preferably automatically using the computer software, to bring detected power to a minimum. The computer controlled phase adjustment 40 is then adjusted, preferably automatically using the computer software, to obtain a minimum on the Hall detected power. The attenuation adjustment and phase adjustment are automatically adjusted using the computer software, to obtain a minimum here. The Hall detector power, forward detector power, and reflected detector power are recorded. The short is removed and replaced with the sample to be checked. The short tuning adjustment 65 of the vacuum chuck position is adjusted to obtain a minimum reflected power. The circular waveguide adjustment 55, attenuation adjustment 35 and phase adjustment 40 are all adjusted for a minimum on the Hall detector. The three powers are then recorded for 0 magnetic field, and then at successive incrementally greater magnetic field strengths. The field strength ranges from 0–9 kG as a minimum. Preferably, the magnetic field is automatically varied using computer software that controls the magnet power supply to obtain the desired magnetic field. In principle, with further developments, significantly lower magnetic field strengths could be used in accordance with the method. The number of magnetic field values and the spacing between magnetic field values can be optimized to maximize analysis accuracy.

Figure 6:
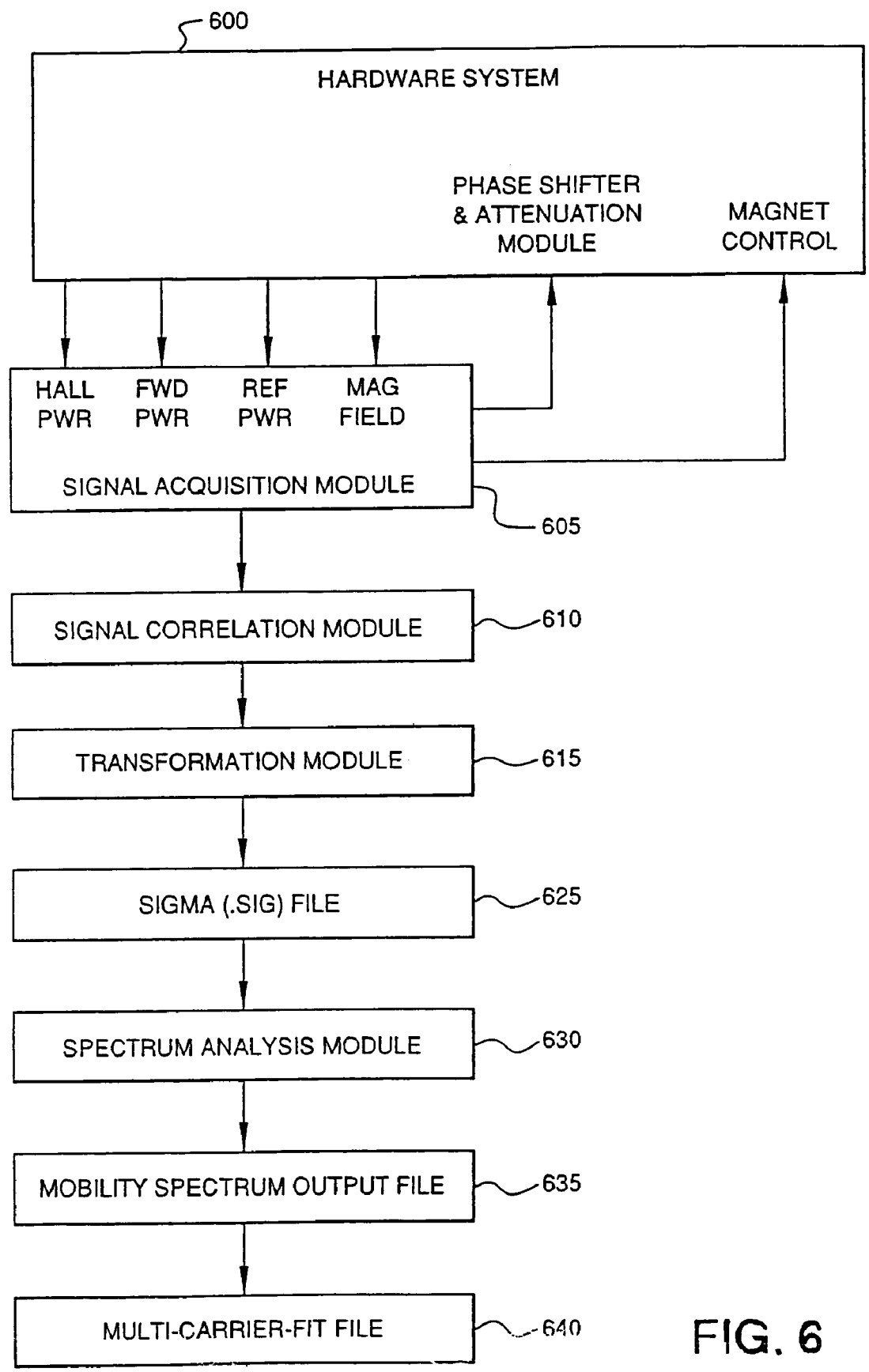
FIG. 6 is a flowchart of software used according to the invention.

The data are then interpreted to obtain mobility, sheet charge density and sheet resistance readings. Referring to FIG. 6, an overview of the software is provided. The software may be written for a personal computer using an Intel Pentium or compatible chip as a processor, and the DOS or Windows operating systems. The hardware system described above is indicated generally by block 600. The first module, 605, is a signal acquisition and control module. This module receives signals from the detectors in the apparatus described above and controls the variable phase shifter and attenuator module as well as the magnet. The received signals are: Hall Power detection; Forward Power detection of Cu Short and Wafer; Reflected Power detection of Cu Short and Wafer; and Magnetic Field Strength detection. Those signals are passed through power amplifiers and/or superhet receivers to analog to digital converters and module 605 obtains values from the digital output. Once these signals are acquired the corresponding voltage input values are passed on to the Signal Correlation Module 610 for further processing.

Signal correlation module 610 receives inputs from the signal acquisition module 605 as raw input voltages. These voltages are input into algorithms to obtain values in correct engineering units. This step is a straightforward correlation.

The output of the signal correlation module 610 is received by the transformation module 615. The transformation module converts the output to Sigma Output file structure 625 which is then read by the Mobility Spectral Analysis Module 630. The Sigma Output file is composed of 14 lines of general test information, typically including the sample name, date, and similar information, followed by a line containing the sample thickness, followed by a line for each magnetic field at which Hall data was collected. Each of these data lines contain tab-separated entries for the magnetic field, Sigma_XX, SD_XX, Sigma_XY, and SD_XY, where SD_XX and SD_XY are the standard deviations for the Sigma_XX and Sigma_XY values, respectively. All entries are in MKSA units, i.e. thickness in meters, magnetic field in Tesla, and conductivities in Siemens/meter. This file is used as input for the Mobility Spectral Analysis Module in order to obtain the final mobility values and sheet charge densities. This module is composed of two separate program dynamic link libraries, which perform a variety of mathematical calculations in order to analyze magnetic field-dependent Hall data. These modules read input data from the Sigma Output file and generate a mobility spectrum output file 635 which includes a mobility spectrum whose peaks indicate the presence of discrete carrier types and a Multi-Carrier-Fit file 640 which includes the most likely mobility and sheet charge density values for those carrier types.

The only way to find solutions that are more precise or quantitative than the mobility spectrum peaks is to restrict the range of possible solutions by making assumptions about the carriers in the specimen. For example, the Multi-Carrier fitting technique makes the explicit assumption that there are a fixed number of carriers—each with a discrete mobility.

The calculations carried out by the software involve the following principles. When the microwave short at the back of the cavity behind the wafer is adjusted to the proper distance, the relationship between an amplitude reflection coefficient $\Gamma_{-}$, the sheet resistance of the wafer R, and the impedance Z of the circular waveguide for the $TE_{11}$ mode is:

$$\Gamma_{-}=(R-Z)/(R+Z)$$

For a circular waveguide of radius 1.045 cm, the impedance has been found to be 697.5 Ohm/square, which enables accurate measurement of a thin cap.

The microwave electric field at the wafer must be determined. The electric field amplitude in various axes, $E_x$, for example, are represented as $E_x=(1+\Gamma_{-})(P_{incident}/A)^{1/2}$, and $E_y=(P_{Hall}/A)^{1/2}$. In the x direction, the amplitude is the sum of the incident and reflected wave amplitudes or the amplitude of the transmitted (standing) wave. For the y direction, the only propagating microwave signal is the Hall wave, which is generated at the wafer and detected in the reflected direction. The value A is a constant, which may be determined by integration across the circular cross section of the waveguide mode. The conductivity, $\sigma_{xx}$, or $\sigma_{xy}$, depending on the axis, can be represented, using these values, as $\sigma_{xx}=(1/Z)(1-\Gamma_{-}^{2}-F^{2})/((1+\Gamma_{-})^{2}+F^{2})$, and as $\sigma_{xy}=(F/(2Z(1+\Gamma_{-}))((1+\Gamma_{-})(3-\Gamma_{-})-F^{2})/((1+\Gamma_{-})^{2}+F^{2})$, where $F=E^{-}_{y1}/E^{+}_{x1}$. There is also a constant coefficient used to multiply the theoretical values of F since the currents that are locally perpendicular to the excited $TE_{11}$ mode do not couple exactly to the orthogonal $TE_{11}$ mode. The constant can be obtained by integration and has a value between 0 and 1. The previous analysis assumes that additional modes that are generated near the wafer are negligible. In some cases that is not valid. For those cases, a multi-mode analysis has been developed and can be used to determine Sigma_XX and Sigma_XY from the reflected microwave powers.

In order to obtain the mobility, the results of the calculations above are employed together with the detected magnetic field intensity B. For one carrier species in a single conductive layer, the carrier mobility is given by $\mu=(\sigma_{xy}/B)/\sigma_{xx}$.

The multi-carrier fitting procedure works as follows: First, the program determines the best fit for a single carrier using the Simplex method to minimize the least-squares deviation between the fitted and measured Hall data ($\sigma_{xx}$ and $\sigma_{xy}$). The uncertainty in each of the measured data is used to weight the terms in the least-squares sum and thereby obtain the most-likely solution. The uncertainties in the derived mobility and carrier density are estimated from the components of the Hessian matrix at the minimum (at the solution).

Next, the program determines the best fit using two carriers. The starting values for the Simplex procedure are obtained by displacing the previously-determined single carrier to slightly higher and lower mobilities. The Simplex procedure is identical to the procedure for a single carrier, except that there are now two mobilities to vary. The uncertainties in the derived parameters are again determined as in the description for a single carrier. The program also uses the statistical F-test to estimate the significance of the second carrier, i.e., it estimates whether addition of the second carrier improved the fit by enough to conclude that a second carrier probably exists. This is a very useful feature since it permits the user to estimate the number of statistically significant carriers that are present in the sample. The procedure continues, adding one carrier at a time and estimating the significance of the added carriers, until the number of carriers exceeds half the number of magnetic fields, at which point the procedure is terminated.

A summary of test results comparing the foregoing techniques to known destructive techniques, namely the contacted single magnetic field DC Hall technique, are set forth below:

TABLE

PHEMT TEST RESULT SUMMARY
A - CONTACTED SINGLE MAGNETIC FIELD DC HALL
B - NONCONTACT MULTIPLE MAGNETIC FIELD RF

THIN CAP PHEMT SAMPLES

|   | Mobility cm2/V-s | Sheet Charge X E12 carriers/cm2 |
|---|---|---|
|   | WAFER #1 |   |
| A | 5391 | 2.67 |
| B | 4721 | 2.848 |
| B | 4780 | 2.837 |
| B | 4753 | 2.859 |
|   | 4751.3 | 2.848 |
| STD | 24.115 | 0.00898146 |
| STD % | 0.508% | 0.315% |
|   | WAFER #2 |   |
| A | 5391 | 2.67 |
| B | 4721 | 2.831 |
| B | 4780 | 2.852 |
| B | 4753 | 2.827 |
|   | 4751.3 | 2.83666667 |
| STD | 24.115 | 0.01096459 |
| STD % | 0.508% | 0.387% |

THICK CAP PHEMT SAMPLE

|   | Mobility cm2/V-s | Sheet Charge X E12 carriers/cm2 |
|---|---|---|
| A | 7096 | 2.44 |
| B | 7783 | 1.46 |

Analysis software may be provided for use in non destructive, noncontact measurements of full semiconductor wafers or flat panel display materials for use by operators with minimal training. Experienced researchers are provided with the capability to perform in depth studies by varying readily accessible test parameters. Such test parameters include the magnet field strength, and attenuation of the microwave signal along the branch. The software also may provide graphic display including plots of the mobility spectra with conductivity and concentration as a function of mobility.

Plots of sheet charge density and mobility as a function of magnetic field may be displayed using a single carrier solution to the data of each field. The single carrier solution is used as a general check of the analysis; a sample with a single carrier should exhibit the same sheet charge density and mobility irrespective of the magnetic field. Conversely, a sample with more than one detectable carrier should exhibit variations as a function of the magnetic field.

All results may be displayed as sheet concentration numbers in the text window of the software. A calculation of the volumetric concentration of electrical carriers could be launched by checking the window of the result-screen of the software. If this operation is selected, the one-carrier solution is extracted by the multi-carrier technique and displayed in a separate window together with the entry fields for layer thickness and carrier type. This information is then used to calculate the depletion widths from the top surface and epi-substrate interfaces, so that the true thickness of the conductive layer can be obtained. Alternatively, the user could enter a thickness and have the program present the volumetric results for the one- or many-carrier fit based on the entered thickness.

It should be noted that single field analysis techniques may be used as an alternative to multi-carrier analysis described above.

It will be appreciated that variations in mobility and sheet charge density across a layer may be obtained by conducting a test on a sample, then moving the sample in the mount in the plane perpendicular to the central axis of circular waveguide 50, and then repeating the test. This process may be repeated in order to obtain a map of mobility and sheet charge density.

While the invention has been described above with respect to particular embodiments, modifications and substitutions within the spirit and scope of the invention will be apparent to those of skill in the art.

What is claimed is:

1. A device for measurement of mobility and sheet charge density in conductive sheet materials, comprising:
    a microwave source;
    a circular waveguide positioned to receive microwave power from said microwave source;
    a mount adapted to position a sheet material item at a measurement location to receive microwave power transmitted from said circular waveguide, said mount having a planar surface and a disc positioned in said mount, said disc being rotatable with respect to said mount about an axis substantially perpendicular to the plane of said mount planar surface, said disc having a bore therein that is not coaxial with said axis so that rotation of the disc adjusts the position of the bore relative to the mount; wherein said bore defines a portion of said sheet material exposed to an output of said circular waveguide;
    a magnet positioned to induce a magnetic field at the measurement location;
    a first detector to detect the power of the microwave source;
    a second detector to detect the power of the microwave power reflected from the sheet material item in the measurement location; and
    a third detector to detect a Hall effect microwave power reflected from the sheet material item.

2. The device of claim 1, further comprising a probe positioned in said circular waveguide, said probe being coupled to said third detector.

3. The device of claim 2, further comprising a directional coupler positioned to receive microwave power from said microwave source, said directional coupler being coupled to a side branch and a main branch, said main branch being coupled to said circular waveguide, and said side branch being coupled to said third detector.

4. The device of claim 3, wherein said side branch is coupled through a variable attenuator and a variable phase shifter to said third detector.

5. The device of claim 1, further comprising calculating means for receiving data from said detectors and for calculating mobility and sheet charge density characteristics of the sheet material item based on said data.

6. The device of claim 5, further comprising a power amplifier for receiving a signal from at least one of said detectors and for providing an output signal to said calculating means.

7. The device of claim 5, further comprising a superheterodyne receiver for receiving a signal from at least one of said detectors and for providing an output signal to said calculating means.

8. The device of claim 1, further comprising a conventional waveguide intermediate said microwave source and said circular waveguide, wherein said circular waveguide is adjustably positioned relative to said conventional waveguide.

9. The device of claim 8, wherein said second detector is positioned to detect reflected microwave field strength in said conventional waveguide.

10. The device of claim 1, further comprising a detector to detect magnetic field strength at the measurement location.

11. The device of claim 1, further comprising a short, made of conductive material, and adjustably mounted so that said measurement location is intermediate said short and an end of said circular waveguide.

12. A device for measurement of mobility and sheet charge density in conductive sheet materials, comprising:
   a microwave source;
   a waveguide positioned to receive microwave power from said microwave source;
   a mount adapted to selectively position a sheet material item at a measurement location so that the sheet material item receives microwave power transmitted from an output of said waveguide; said mount comprising a first surface and an adjustable disc, the adjustable disc being coupled to said mount to rotate with respect to said mount about an axis substantially perpendicular to the first surface; said adjustable disc further having a bore therein that is not coaxial with said axis such that rotation of the disc adjusts the position of the bore relative to the mount; wherein said bore defines a portion of said sheet material exposed to the output of said waveguide;
   a magnet positioned to induce a magnetic field at the measurement location;
   a first detector for detecting a power of the microwave source;
   a second detector for detecting microwave power reflected from the sheet material item in the measurement location; and
   a third detector for detecting Hall effect microwave power reflected from the sheet material item.

13. The device of claim 12, wherein said waveguide is a circular waveguide and said mount is a vacuum chuck.

14. The device of claim 12, further comprising a base, said mount being rotatably connected to said base via a set screw to allow the mount to be rotated into a desired position adjacent said waveguide.

15. The device of claim 14, wherein the base comprises a stationary portion and a movable portion, the mount being connected to said movable portion, said movable portion being movable with respect to said stationary portion along an axis substantially perpendicular to an axis of said set screw to permit adjustment of a gap between the mount and the output of the waveguide.

16. The device of claim 15, wherein the movable portion and the stationary portion comprise corresponding grooves and rails to permit adjustment of the position of the movable portion in only one direction.

17. A device for measurement of mobility and sheet charge density in conductive sheet materials, comprising:
   a microwave source;
   a circular waveguide for receiving microwave power from said microwave source;
   a mount adapted to selectively position a sheet material item at a measurement location so that the sheet material item receives microwave power transmitted from an output of said waveguide; said mount comprising an adjustable disc rotatably coupled to said mount; said adjustable disc further having a bore therein that is not coaxial with an axis of rotation of said adjustable disc such that rotation of the disc adjusts the position of the bore relative to the mount; wherein said bore defines a portion of said sheet material exposed to the output of said waveguide;
   a magnet positioned to induce a magnetic field at the measurement location;
   a first detector for detecting a power of the microwave source;
   a second detector for detecting microwave power reflected from the sheet material item; and
   a third detector for detecting Hall effect microwave power reflected from the sheet material item.

18. The device of claim 17, further comprising calculating means for receiving data from the detectors and for calculating mobility and sheet charge density characteristics of the sheet material item based on said data.

19. The device of claim 18, further comprising a base having stationary and movable portions, the mount rotatably connected to the movable portion, the movable portion being movable with respect to said stationary portion along an axis substantially perpendicular to an axis of said set screw to permit adjustment of a gap between the mount and the output of the waveguide.

20. The device of claim 19, wherein the movable and stationary portions comprise corresponding grooves and rails to permit adjustment of the position of the movable portion in only one direction.

* * * * *